US012149234B2

United States Patent
Kuo

(10) Patent No.: US 12,149,234 B2
(45) Date of Patent: Nov. 19, 2024

(54) ELECTRONIC DEVICE AND SWITCH CIRCUIT

(71) Applicant: Quanta Computer Inc., Taoyuan (TW)

(72) Inventor: Hsin-Chih Kuo, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 70 days.

(21) Appl. No.: 18/308,066

(22) Filed: Apr. 27, 2023

(65) Prior Publication Data
US 2024/0333279 A1  Oct. 3, 2024

(30) Foreign Application Priority Data
Mar. 30, 2023 (TW) ............................ 112112187

(51) Int. Cl.
*H03K 17/16* (2006.01)
(52) U.S. Cl.
CPC ................. *H03K 17/161* (2013.01)
(58) Field of Classification Search
None
See application file for complete search history.

(56) References Cited

U.S. PATENT DOCUMENTS

| 6,611,070 | B2 * | 8/2003 | Cayrou | H03K 17/002 |
| | | | | 307/130 |
| 7,965,127 | B2 * | 6/2011 | Svensson | H03K 17/163 |
| | | | | 327/437 |
| 9,030,252 | B2 | 5/2015 | Makita | |
| 10,673,333 | B1 * | 6/2020 | Tseng | H02M 3/156 |

FOREIGN PATENT DOCUMENTS

TW  201208252 A  2/2012

OTHER PUBLICATIONS

Chinese language office action dated Feb. 5, 2024, issued in application No. TW 112112187.

\* cited by examiner

*Primary Examiner* — Jeffrey S Zweizig
(74) *Attorney, Agent, or Firm* — McClure, Qualey & Rodack, LLP

(57) ABSTRACT

An electronic device includes a first switch circuit, a second switch circuit, and a mechanical switch. The first switch circuit is coupled to a control node. The first switch circuit is configured to generate a first control voltage. The second switch circuit is coupled to the control node. The second switch circuit is configured to generate a second control voltage. The mechanical switch is configured to selectively couple the control node to a ground voltage. When the first switch circuit is switched, the second control voltage is not affected. When the second switch circuit is switched, the first control voltage is not affected.

10 Claims, 3 Drawing Sheets

ELECTRONIC DEVICE AND SWITCH CIRCUIT

CROSS REFERENCE TO RELATED APPLICATIONS

This application claims priority of Taiwan Patent Application No. 112112187 filed on Mar. 30, 2023, the entirety of which is incorporated by reference herein.

BACKGROUND OF THE INVENTION

Field of the Invention

The disclosure generally relates to an electronic device, and more specifically, to an electronic device for reducing interference.

Description of the Related Art

In conventional electronic devices, if the design calls for several switch circuits, there may be non-ideal interference induced between the different signals of these switch circuits, thereby affecting the overall performance of the electronic device. Accordingly, there is a need to propose a novel solution for solving this problem of the prior art.

BRIEF SUMMARY OF THE INVENTION

In an exemplary embodiment, the invention is directed to an electronic device that includes a first switch circuit, a second switch circuit, and a mechanical switch. The first switch circuit is coupled to a control node. The first switch circuit is configured to generate a first control voltage. The second switch circuit is coupled to the control node. The second switch circuit is configured to generate a second control voltage. The mechanical switch is configured to selectively couple the control node to a ground voltage. When the first switch circuit is switched, the second control voltage is not affected. When the second switch circuit is switched, the first control voltage is not affected.

In some embodiments, the first switch circuit includes a first diode and a first resistor. The first diode has an anode coupled to a first node, and a cathode coupled to the control node. The first resistor has a first terminal coupled to a first supply voltage, and a second terminal coupled to the first node.

In some embodiments, the first switch circuit further includes a first transistor and a second resistor. The first transistor has a control terminal coupled to the first node, a first terminal coupled to the first supply voltage, and a second terminal coupled to a second node. The second resistor has a first terminal coupled to the second node, and a second terminal coupled to the ground voltage.

In some embodiments, the first switch circuit further includes a third resistor and a second transistor. The third resistor has a first terminal coupled to the first supply voltage, and a second terminal coupled to a first output node for outputting the first control voltage. The second transistor has a control terminal coupled to the second node, a first terminal coupled to the ground voltage, and a second terminal coupled to the first output node.

In some embodiments, the first transistor is a PMOSFET (P-type Metal Oxide Semiconductor Field Effect Transistor), and the second transistor is an NMOSFET (N-type Metal Oxide Semiconductor Field Effect Transistor).

In some embodiments, the second switch circuit includes a second diode and a fourth resistor. The second diode has an anode coupled to a third node, and a cathode coupled to the control node. The fourth resistor has a first terminal coupled to a second supply voltage, and a second terminal coupled to the third node.

In some embodiments, the second switch circuit further includes a third transistor and a fifth resistor. The third transistor has a control terminal coupled to the third node, a first terminal coupled to the second supply voltage, and a second terminal coupled to a fourth node. The fifth resistor has a first terminal coupled to the fourth node, and a second terminal coupled to the ground voltage.

In some embodiments, the second switch circuit further includes a sixth resistor and a fourth transistor. The sixth resistor has a first terminal coupled to the second supply voltage, and a second terminal coupled to a second output node for outputting the second control voltage. The fourth transistor has a control terminal coupled to the fourth node, a first terminal coupled to the ground voltage, and a second terminal coupled to the second output node.

In some embodiments, the third transistor is a PMOSFET, and the fourth transistor is an NMOSFET.

In another exemplary embodiment, the invention is directed to a switch circuit that includes a diode, a first transistor, a second transistor, a first resistor, a second resistor, and a third resistor. The diode has an anode coupled to a first node, and a cathode coupled to a control node. The first resistor has a first terminal coupled to a supply voltage, and a second terminal coupled to the first node. The first transistor has a control terminal coupled to the first node, a first terminal coupled to the supply voltage, and a second terminal coupled to a second node. The second resistor has a first terminal coupled to the second node, and a second terminal coupled to a ground voltage. The third resistor has a first terminal coupled to the supply voltage, and a second terminal coupled to an output node for outputting a control voltage. The second transistor has a control terminal coupled to the second node, a first terminal coupled to the ground voltage, and a second terminal coupled to the output node.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
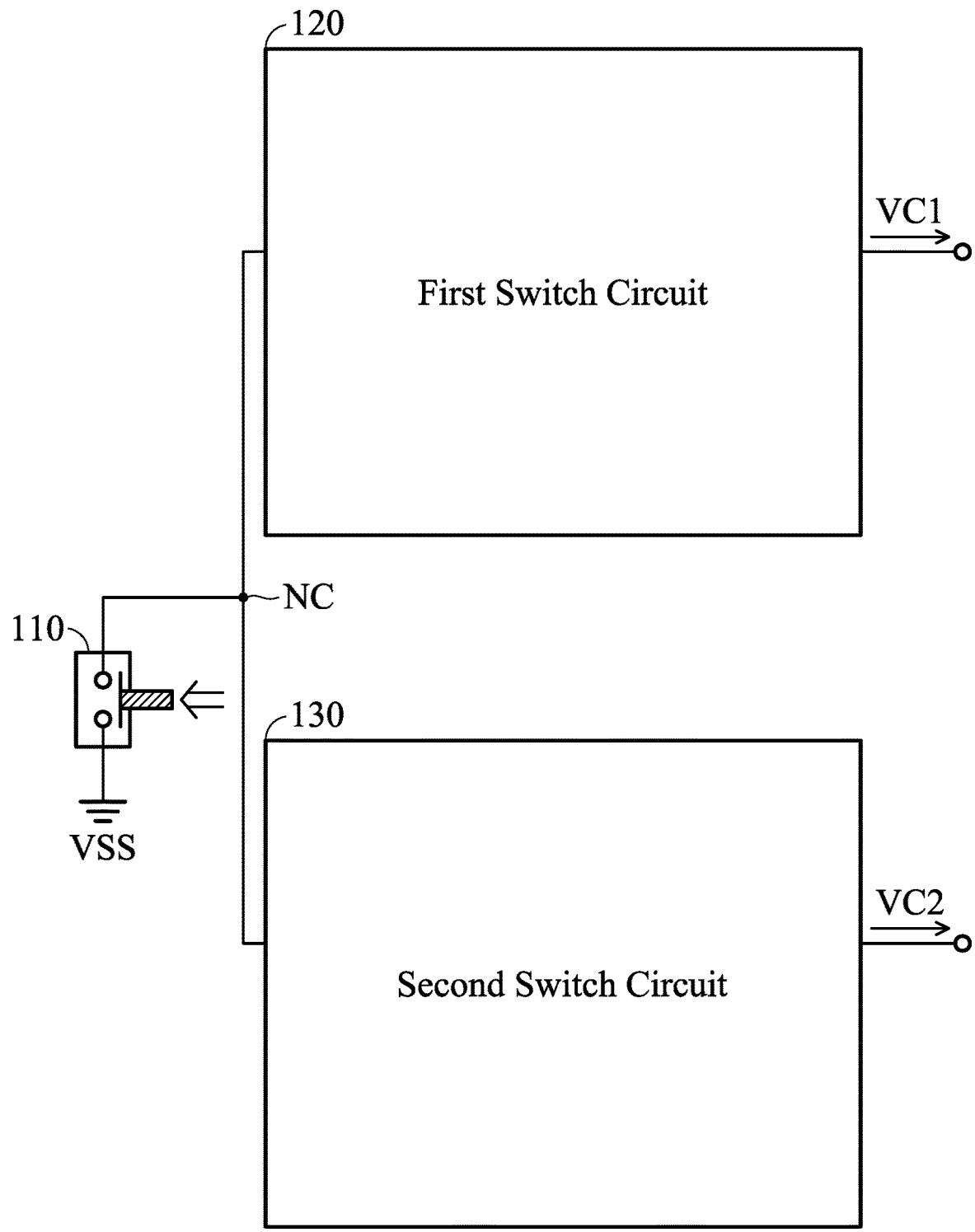
FIG. 1 is a diagram of an electronic device according to an embodiment of the invention.

In order to illustrate the purposes, features and advantages of the invention, the embodiments and figures of the invention are described in detail below.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagram of an electronic device 100 according to an embodiment of the invention. The electronic device 100 may be applied to a mobile device, such as a smart phone, a tablet computer, or a notebook computer. As shown in FIG. 1, the electronic device 100 includes a mechanical switch 110, a first switch circuit 120, and a second switch circuit 130. It should be understood that the electronic device 100 may further include other components, such as a processor, a power supply module, and/or an I/O (Input/Output) interface, although they are not displayed in FIG. 1.

The mechanical switch 110 is configured to selectively couple a control node NC to a ground voltage VSS (e.g., 0V). For example, if the mechanical switch 110 is pressed by an external force, it may couple the control node NC to the ground voltage VSS (i.e., the mechanical switch 110 is considered as a short-circuited path). Conversely, if the mechanical switch 110 is not pressed by any external force, it may not couple the control node NC to the ground voltage VSS (i.e., the mechanical switch 110 is considered as an open-circuited path).

The first switch circuit 120 is coupled to the control node NC. The first switch circuit 120 is configured to generate a first control voltage VC1. The second switch circuit 130 is coupled to the control node NC. The second switch circuit 130 is configured to generate a second control voltage VC2. It should be noted that when the first switch circuit 120 is switched, the second control voltage VC2 is not affected, and when the second switch circuit 130 is switched, the first control voltage VC1 is not affected. With the proposed design of the invention, even if the first switch circuit 120 and the second switch circuit 130 are both coupled to the mechanical switch 110, they will be operated independently, effectively suppressing any interference between the first switch circuit 120 and the second switch circuit 130.

In some embodiments, the electronic device 100 is applied in a gaming machine (not shown). The first control voltage VC1 can be used as a power-on signal of the gamine machine, and the second control voltage VC2 can be used as a sleep signal of the gaming machine. For example, the aforementioned gaming machine may be switchable between a plurality of operational modes by using the mechanical switch 110, and the aforementioned operational modes may include a sleep mode, a wake-up mode, and a reset mode, but they are not limited thereto.

The following embodiments will introduce different configurations and detailed structural features of the electronic device 100. It should be understood these figures and descriptions are merely exemplary, rather than limitations of the invention.

Figure 2:
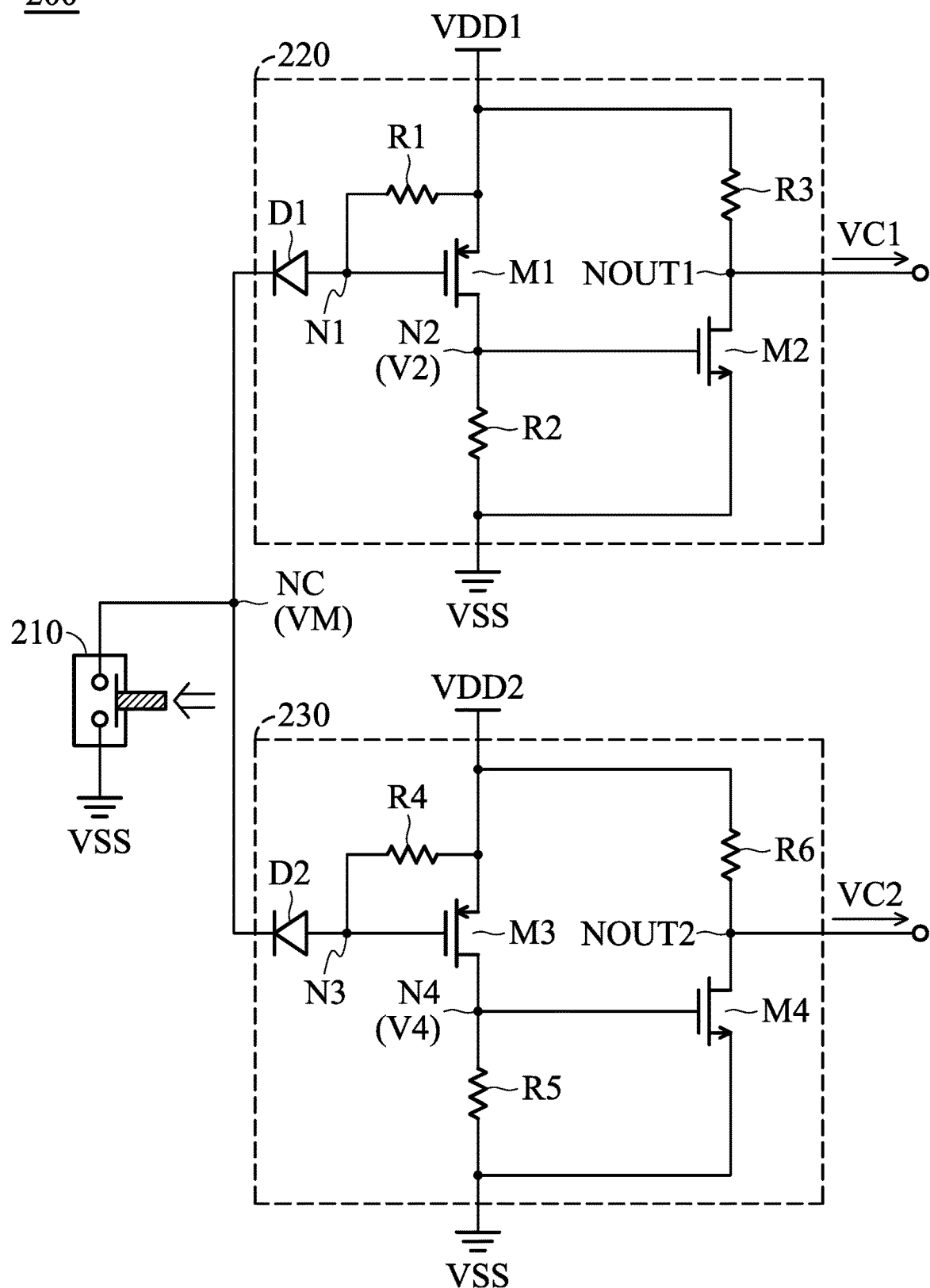
FIG. 2 is a diagram of circuitry of an electronic device according to an embodiment of the invention.

FIG. 2 is a diagram of circuitry of an electronic device 200 according to an embodiment of the invention. FIG. 2 is similar to FIG. 1. In the embodiment of FIG. 2, the electronic device 200 includes a mechanical switch 210, a first switch circuit 220, and a second switch circuit 230. The mechanical switch 210 is configured to selectively couple a control node NC to a ground voltage VSS. However, its operations have been described in the previous embodiment, and they will not be described again herein.

In the embodiment of FIG. 2, the first switch circuit 220 includes a first transistor M1, a second transistor M2, a first diode D1, a first resistor R1, a second resistor R2, and a third resistor R3. For example, the first transistor M1 may be a PMOSFET (P-type Metal Oxide Semiconductor Field Effect Transistor), and the second transistor M2 may be an NMOSFET (N-type Metal Oxide Semiconductor Field Effect Transistor), but they are not limited thereto.

The first diode D1 has an anode coupled to a first node N1, and a cathode coupled to the control node NC. The first resistor R1 has a first terminal coupled to a first supply voltage VDD1, and a second terminal coupled to the first node N1.

The first transistor M1 has a control terminal (e.g., a gate) coupled to the first node N1, a first terminal (e.g., a source) coupled to the first supply voltage VDD1, and a second terminal (e.g., a drain) coupled to a second node N2. The second resistor R2 has a first terminal coupled to the second node N2, and a second terminal coupled to the ground voltage VSS.

The third resistor R3 has a first terminal coupled to the first supply voltage VDD1, and a second terminal coupled to a first output node NOUT1 for outputting a first control voltage VC1. The second transistor M2 has a control terminal (e.g., a gate) coupled to the second node N2, a first terminal (e.g., a source) coupled to the ground voltage VSS, and a second terminal (e.g., a drain) coupled to the first output node NOUT1.

The operational principles of the first switch circuit 220 of some embodiments are as follows. If the mechanical switch 210 couples the control node NC to the ground voltage VSS, the first transistor M1 can be enabled. At this time, the voltage V2 at the second node N2 can be pulled up for enabling the second transistor M2. Finally, the first switch circuit 220 can generate the first control voltage VC1 with a low logic level, which may be almost the same as the ground voltage VSS.

Conversely, if the mechanical switch 210 does not couple the control node NC to the ground voltage VSS, the first transistor M1 can be disabled. At this time, the voltage V2 at the second node N2 can be pulled down for disabling the second transistor M2. Finally, the first switch circuit 220 can generate the first control voltage VC1 with a high logic level, which may be almost the same as the first supply voltage VDD1.

Furthermore, in the embodiment of FIG. 2, the second switch circuit 230 includes a third transistor M3, a fourth transistor M4, a second diode D2, a fourth resistor R4, a fifth resistor R5, and a sixth resistor R6. For example, the third transistor M3 may be another PMOSFET, and the fourth transistor M4 may be another NMOSFET, but they are not limited thereto.

The second diode D2 has an anode coupled to a third node N3, and a cathode coupled to the control node NC. The fourth resistor R4 has a first terminal coupled to a second supply voltage VDD2, and a second terminal coupled to the third node N3. For example, the second supply voltage VDD2 may be the same as or different from the aforementioned first supply voltage VDD1.

The third transistor M3 has a control terminal (e.g., a gate) coupled to the third node N3, a first terminal (e.g., a source) coupled to the second supply voltage VDD2, and a second terminal (e.g., a drain) coupled to a fourth node N4. The fifth resistor R5 has a first terminal coupled to the fourth node N4, and a second terminal coupled to the ground voltage VSS.

The sixth resistor R6 has a first terminal coupled to the second supply voltage VDD2, and a second terminal coupled to a second output node NOUT2 for outputting a second control voltage VC2. The fourth transistor M4 has a control terminal (e.g., a gate) coupled to the fourth node N4, a first terminal (e.g., a source) coupled to the ground voltage VSS, and a second terminal (e.g., a drain) coupled to the second output node NOUT2.

In some embodiments, the operational principles of the second switch circuit 230 are as outlined in the following description. If the mechanical switch 210 couples the control node NC to the ground voltage VSS, the third transistor M3 can be enabled. At this time, the voltage V4 at the fourth node N4 can be pulled up for enabling the fourth transistor M4. Finally, the second switch circuit 230 can generate the second control voltage VC2 with a low logic level, which may be almost the same as the ground voltage VSS.

Conversely, if the mechanical switch 210 does not couple the control node NC to the ground voltage VSS, the third transistor M3 can be disabled. At this time, the voltage V4 at the fourth node N4 can be pulled down for disabling the fourth transistor M4. Finally, the second switch circuit 230 can generate the second control voltage VC2 with a high logic level, which may be almost the same as the second supply voltage VDD2.

In some embodiments, the element parameters of the electronic device 200 are as outlined in the following description. The first supply voltage VDD1 may be from 3V to 5V. The second supply voltage VDD2 may be from 3V to 5V. The first resistor R1, the third resistor R3, the fourth resistor R4, and the sixth resistor R6 may have the same resistances, which may be about 100 kΩ. In addition, the second resistor R2 and the fifth resistor R5 may have the same resistances, which may be about 499 kΩ. It should be understood that the above element parameters are merely exemplary, which are adjustable according to different requirements.

In some embodiments, if the first supply voltage VDD1 and the second supply voltage VDD2 are both set to 3.3V, according to practical measurements, the first control voltage VC1, the second control voltage VC2, and a common voltage VM at the control node NC will be described as the following Table I:

TABLE I

Voltage Levels of Practical Measurements

| State of Mechanical Switch | Whether First Control Voltage Is Forced to Be Grounded | Common Voltage VM | First Control Voltage VC1 | Second Control Voltage VC2 |
|---|---|---|---|---|
| Closed | No | 0 V | 0 V | 0 V |
| Closed | Yes | 0 V | 0 V | 0 V |
| Opened | No | 3.324 V | 3.295 V | 3.334 V |
| Opened | Yes | 3.324 V | 0 V | 3.334 V |

According to the measurement of Table I, when the first control voltage VC1 or the second control voltage VC2 has a low logic level, it may be almost the same as the ground voltage VSS, such that the output accuracy of the electronic device 200 can be significantly improved. Also, when the first switch circuit 220 is switched (e.g., the first control voltage VC1 is forced to be grounded, or the level of the first control voltage VC1 is changed), the second control voltage VC2 of the second switch circuit 230 and the common voltage VM at the control node NC are almost not affected. In other words, non-ideal interference between the first switch circuit 220 and the second switch circuit 230 can be minimized. Other features of the electronic device 200 of FIG. 2 are similar to those of the electronic device 100 of FIG. 1. Therefore, the two embodiments can achieve similar levels of performance.

Figure 3:
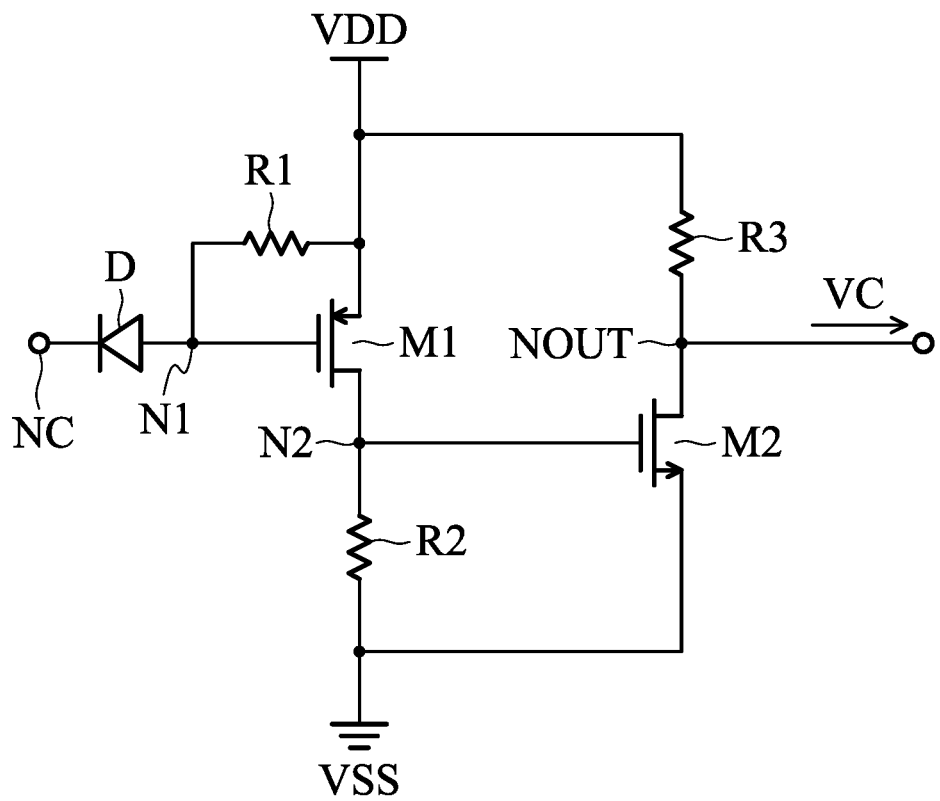
FIG. 3 is a diagram of circuitry of a switch circuit according to an embodiment of the invention.

FIG. 3 is a diagram of circuitry of a switch circuit 300 according to an embodiment of the invention. FIG. 3 is similar to FIG. 2. In the embodiment of FIG. 3, the switch circuit 300 can be used independently, and it is not necessary to combine the switch circuit 300 with the aforementioned electronic device 200. Specifically, the switch circuit 300 includes a first transistor M1, a second transistor M2, a diode D, a first resistor R1, a second resistor R2, and a third resistor R3. For example, the first transistor M1 may be a PMOSFET, and the second transistor M2 may be an NMOSFET.

The diode D has an anode coupled to a first node N1, and a cathode coupled to a control node NC. The first resistor R1 has a first terminal coupled to a supply voltage VDD, and a second terminal coupled to the first node N1. The first transistor M1 has a control terminal (e.g., a gate) coupled to the first node N1, a first terminal (e.g., a source) coupled to the supply voltage VDD, and a second terminal (e.g., a drain) coupled to a second node N2. The second resistor R2 has a first terminal coupled to the second node N2, and a second terminal coupled to the ground voltage VSS. The third resistor R3 has a first terminal coupled to the supply voltage VDD, and a second terminal coupled to an output node NOUT for outputting a control voltage VC. The second transistor M2 has a control terminal (e.g., a gate) coupled to the second node N2, a first terminal (e.g., a source) coupled to the ground voltage VSS, and a second terminal (e.g., a drain) coupled to the output node NOUT. Other features of the switch circuit 300 of FIG. 3 are similar to those of the electronic device 200 of FIG. 2. Therefore, the two embodiments can achieve similar levels of performance.

The invention proposes a novel electronic device. According to practical measurements, the electronic device using the aforementioned design can significantly reduce the level of non-ideal interference between switch circuits, and therefore it is suitable for application in a variety of devices.

Note that the above voltages, currents, resistances, inductances, capacitances and other element parameters are not limitations of the invention. A designer can adjust these settings according to different requirements. The electronic device and the switch circuit of the invention are not limited to the configurations of FIGS. 1-3. The invention may merely include any one or more features of any one or more embodiments of FIGS. 1-3. In other words, not all of the features displayed in the figures should be implemented in the electronic device and the switch circuit of the invention. Although the embodiments of the invention use MOSFET as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc., without affecting the performance of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a first switch circuit, coupled to a control node, wherein the first switch circuit is configured to generate a first control voltage;
   a second switch circuit, coupled to the control node, wherein the second switch circuit is configured to generate a second control voltage; and
   a mechanical switch, selectively coupling the control node to a ground voltage;
   wherein when the first switch circuit is switched, the second control voltage is not affected, and wherein when the second switch circuit is switched, the first control voltage is not affected.

2. The electronic device as claimed in claim 1, wherein the first switch circuit comprises:
   a first diode, wherein the first diode has an anode coupled to a first node, and a cathode coupled to the control node; and
   a first resistor, wherein the first resistor has a first terminal coupled to a first supply voltage, and a second terminal coupled to the first node.

3. The electronic device as claimed in claim 2, wherein the first switch circuit further comprises:
   a first transistor, wherein the first transistor has a control terminal coupled to the first node, a first terminal coupled to the first supply voltage, and a second terminal coupled to a second node; and
   a second resistor, wherein the second resistor has a first terminal coupled to the second node, and a second terminal coupled to the ground voltage.

4. The electronic device as claimed in claim 3, wherein the first switch circuit further comprises:
   a third resistor, wherein the third resistor has a first terminal coupled to the first supply voltage, and a second terminal coupled to a first output node for outputting the first control voltage; and
   a second transistor, wherein the second transistor has a control terminal coupled to the second node, a first terminal coupled to the ground voltage, and a second terminal coupled to the first output node.

5. The electronic device as claimed in claim 4, wherein the first transistor is a PMOSFET (P-type Metal Oxide Semiconductor Field Effect Transistor), and the second transistor is an NMOSFET (N-type Metal Oxide Semiconductor Field Effect Transistor).

6. The electronic device as claimed in claim 1, wherein the second switch circuit comprises:
   a second diode, wherein the second diode has an anode coupled to a third node, and a cathode coupled to the control node; and
   a fourth resistor, wherein the fourth resistor has a first terminal coupled to a second supply voltage, and a second terminal coupled to the third node.

7. The electronic device as claimed in claim 6, wherein the second switch circuit further comprises:
   a third transistor, wherein the third transistor has a control terminal coupled to the third node, a first terminal coupled to the second supply voltage, and a second terminal coupled to a fourth node; and
   a fifth resistor, wherein the fifth resistor has a first terminal coupled to the fourth node, and a second terminal coupled to the ground voltage.

8. The electronic device as claimed in claim 7, wherein the second switch circuit further comprises:
   a sixth resistor, wherein the sixth resistor has a first terminal coupled to the second supply voltage, and a second terminal coupled to a second output node for outputting the second control voltage; and
   a fourth transistor, wherein the fourth transistor has a control terminal coupled to the fourth node, a first terminal coupled to the ground voltage, and a second terminal coupled to the second output node.

9. The electronic device as claimed in claim 8, wherein the third transistor is a PMOSFET, and the fourth transistor is an NMOSFET.

10. A switch circuit, comprising:
    a diode, wherein the diode has an anode coupled to a first node, and a cathode coupled to a control node;
    a first resistor, wherein the first resistor has a first terminal coupled to a supply voltage, and a second terminal coupled to the first node;
    a first transistor, wherein the first transistor has a control terminal coupled to the first node, a first terminal coupled to the supply voltage, and a second terminal coupled to a second node;
    a second resistor, wherein the second resistor has a first terminal coupled to the second node, and a second terminal coupled to a ground voltage;
    a third resistor, wherein the third resistor has a first terminal coupled to the supply voltage, and a second terminal coupled to an output node for outputting a control voltage; and
    a second transistor, wherein the second transistor has a control terminal coupled to the second node, a first terminal coupled to the ground voltage, and a second terminal coupled to the output node.

* * * * *